United States Patent
Sorrells et al.

(10) Patent No.: US 8,340,911 B2
(45) Date of Patent: Dec. 25, 2012

(54) COMPENSATED ENSEMBLE CRYSTAL OSCILLATOR FOR USE IN A WELL BOREHOLE SYSTEM

(75) Inventors: Martin Sorrells, Conroe, TX (US); James Minto, Houston, TX (US)

(73) Assignee: Weatherford Canada Partnership, Edmonton (CA)

( * ) Notice: Subject to any disclaimer, the term of this patent is extended or adjusted under 35 U.S.C. 154(b) by 1932 days.

(21) Appl. No.: 11/279,130

(22) Filed: Apr. 10, 2006

(65) Prior Publication Data
US 2006/0192625 A1  Aug. 31, 2006

Related U.S. Application Data

(62) Division of application No. 10/618,282, filed on Jul. 9, 2003, now Pat. No. 7,046,584.

(51) Int. Cl.
*G01V 1/46* (2006.01)
(52) U.S. Cl. .................................. 702/6; 702/7; 702/11
(58) Field of Classification Search .................. 702/6, 7, 702/8, 9, 11; 331/158
See application file for complete search history.

(56) References Cited

U.S. PATENT DOCUMENTS

| | | | |
|---|---|---|---|
| 4,633,422 A | 12/1986 | Brauer | |
| 5,155,490 A * | 10/1992 | Spradley et al. | 342/357.44 |
| 5,250,871 A * | 10/1993 | Driscoll et al. | 310/348 |
| 5,555,220 A | 9/1996 | Minto | |
| 5,585,556 A | 12/1996 | Petersen et al. | |
| 5,608,360 A | 3/1997 | Driscoll | |
| 5,842,149 A | 11/1998 | Harrell et al. | |
| 5,940,027 A * | 8/1999 | Forseth et al. | 342/357.62 |
| 6,023,444 A | 2/2000 | Naville et al. | |
| 6,308,137 B1 | 10/2001 | Underhill et al. | |
| 6,382,332 B1 | 5/2002 | Eaton | |
| 7,046,584 B2 * | 5/2006 | Sorrells et al. | 368/159 |
| 2002/0008197 A1 * | 1/2002 | Mickael | 250/269.2 |
| 2002/0060952 A1 | 5/2002 | Cecconi et al. | |
| 2002/0173284 A1 | 11/2002 | Forrester | |
| 2004/0246059 A1 * | 12/2004 | Varsamis et al. | 331/176 |

FOREIGN PATENT DOCUMENTS

| | | |
|---|---|---|
| EP | 0716319 A2 | 6/1998 |
| EP | 1002934 A2 | 5/2000 |
| WO | WO98/17894 | 4/1998 |

OTHER PUBLICATIONS

Raymond L. Filler, The Acceleration Sensitivity of quartz Crystal Oscillators: A Review IEEE Transactions on Ultrasonics, Ferroelectrics, and Frequency Control vol. 35, No. 3, May 1988.

(Continued)

*Primary Examiner* — Michael Nghiem
*Assistant Examiner* — Paul D Lee
(74) *Attorney, Agent, or Firm* — Wong, Cabello, Lutsch, Rutherford & Brucculeri, LLP (57) ABSTRACT

A compensated ensemble crystal oscillator clock system. The clock system includes preferably four quad compensated clocks, a compensated temperature sensor, and software for processing and correcting system response. Physical fabrication of elements of the quad compensated clocks, the compensated temperature sensor and cooperating software minimized drift in frequency of the oscillator clock system in harsh borehole environments encountered while drilling a borehole. The clock system exhibits a frequency stability of $2.8 \times 10^{-9}$ or less over a temperature range of from 0° C. to 185° C. The compensated ensemble crystal oscillator clock system is particularly applicable to seismic-while-drilling operations wherein precise downhole measurements of time are required typically over a period of days.

20 Claims, 3 Drawing Sheets

OTHER PUBLICATIONS

R.C. Smythe, Acceleration Effects in Crystal Filters: A Tutorial IEEE Transactions on Ultrasonics, Ferroelectrics, and Frequency Control vol. 39, No. 3, May 1992.

Roger W Ward, The Constants of Alpha Quartz 14th Piezoelectric Devices Conference and Exhibits, Sep. 15-17, 1992.

John R. Vig, Introduction to Quartz Frequency Standards Army Reserach Laboratory: SLCET-TR-91-1 (Rev. 1), Oct. 1992.

Arthur Ballato, Piezoelectricity: Venerable Effect, Modem Thrusts Army Research Laboratory; ARL-TR-70, Aug. 1994.

Arthur Ballatto. Doubly Rotated Thickness Mode Plate Vibrators US Army Electronics Technology & Devices Laboratory (reprinted from Physical Acoustics vol. XIII, 1977, Academic Press Inc ).

John R. Vig, and Thrygve R. Meeker, The Aging of Bulk Acoustic Wave Resonators, Filters and Oscillators; US Army Communications-Elecronics Command, 45th Annual Symposium on Frequency Control, pp. 77-101, 1991.

John A Kustes and John R. Vig, Hysteresis in Quartz Resonators: A Review IEEE Transactions of Ultrasonics, Ferroelectrics, and Frequency Control, vol. 39, No. 3, May 1991.

Errol P Earnisse, Roger W. Ward, Robert B. Wiggins, Survey of Quartz Bulk Resonator Sensor Technologies, IEEE Transactions of Ultransonics, Ferroelectrics and Frequency Control, vol. 35, No. 3, May 1988.

R. Brendel, Influence of a Magnetic Field on Quartz Crystal Resonators IEEE Transactions an Ultrasonics, Ferroelectrics, and Frequency Control, vol. 43, No. 5, pp. 818-831, Sep. 1996.

Colin K. Campbell, Applications of Surface Acoustic and Shallow Bulk Acoustic Wave Devices, Proceedings of the IEEE, vol. 77, No. 10 Oct. 1989.

George Kamas and Sandra Howe, Coordinated Universal Time (UTC) and Leap Second Time and Frequency Users Manual, NBS Special Publication 559, Chapter 2, Section 2.1, Nov. 1979 (updated May 1997).

W. J. Riley, The Calculation of Time Domain Fequency Stability—a revised version of these 2 papers: A Test Suite for the Calculation of Time Domain Frequency Stability, Proc 1995 IEEE Freq Contrl. Symp., pp. 360-365, Jun. 1995 and Addendum to a Test Suite for the Calculation of Time Domain Frequency Stability, Proc. 1996 IEEE Freq. Contrl. Symp , pp, 880-882, Jun. 1996.

John R Vig and Arthur Ballato, Frequency Control Devices, reprints from Ultasonic Instruments and Devices 1999, Academic Press, Inc. pp. 637-701.

Errol P. EerNisse, Quartz Crystals vs Their Environment: Time Bases or Sensors?: Tutorials, IEEE, Frequency Control Reference and Tutorial Information.

Fabien Josse and Richard W. Cernosek; Resonant Piezoelectric Devices as Physical and Biochemical Sensors; 2002 IEEE International Frequency Control Symposium Tutorials, New Orleans Jun. 1, 2002.

Leonhard M. Reindl, Wireless Passive SAW Identification Marks and Sensors; A Tutorial 2002 IEEE International Frequency Control Symposium Tutorials, New Orleans, Jun. 1, 2002.

John R. Vig; Quartz Crystal Resonators and Oscillators; A Tutorial 2002 IEEE International Frequency Control Symposium Tutorials, New Orleans, Jun. 1, 2002.

Michael M. Driscoll; Low Noise Oscillator Design and Performance: A Tutorial 2002 IEEE International Frequency Control Symposium Tutorials, New Orleans, Jun. 1, 2002.

Jeremy K Everard; The Fundamental Theory of Low Noise Oscillators with Special Reference to Some Detailed Designs; A Tutorial IEEE Frequency Control Symposium Tutorial Kansas City Jun. 6, 2000.

Leonard S. Cutler; Passive Atomic Frequency Standards: A Tutorial 2002 IEEE International Frequency Control Symposium Tutorials, New Orleans, Jun. 1, 2002.

W. J. Riley; Rubidium Frequency Standard Technology: A Tutorial PTTI 2002 Tutorial, Reston, VA Dec. 2, 2002.

Lute Maleki; Advanced Atomic Clocks; A Tutorial 2000 IEEE International Frequency Control Symposium Tutorials, Kansas City Jun. 6, 2000.

X. Steve Yao; Photonic Techniques for Frequency and Timing: A Tutorial 2000 IEEE International Frequency Control Symposium Tutorials, Kansas City Jun. 6, 2000.

G. John Dick; Sapphire Microwave Frequency Sources; A Tutorial 2002 IEEE International Frequency Control Symposium Tutorials, New Orleans, Jun. 1, 2002.

Eva S. Ferre-Pikal; PM and AM Noise Measurement Techniques—Part I: A Tutorial 2002 IEEE International Frequency Control Symposium Tutorials, New Orleans, Jun. 1, 2002.

Craig Nelson; PM & AM Noise II: A Tutorial 2002 IEEE International Frequency Control Symposium Tutorials, New Orleans, Jun. 1, 2002.

Victor S. Reinhardt; The Basics of Statistical Processes and Time and Frequency; A Tutorial 2002 IEEE International Frequency Control Symposium Tutorials, New Orleans, Jun. 1, 2002.

Don Percival; An Introduction to the Wavelet Analysis of Time Series; A Tutorial 2000 IEEE International Frequency Control Symposium Tutorials, Kansas City Jun. 6, 2000.

Venceslav F Kroupa; Principles of Phase Locked Loops (PLL): A Tutorial 2000 IEEE International Frequency Control Symposium Tutorials. Kansas City Jun. 6, 2000.

Bob Temple; Clock Jitter—Jitter Estimation from Frequency Domain Measurements: A Tutorial 2000 IEEE International Frequency Control Symposium Tutorials, Kansas City Jun. 6, 2000.

Thomas E. Parker; Introduction to Tirne and Frequency Transfer: A Tutorial 2002 IEEE International Frequency Control Symposium Tutorials, New Orleans, Jun. 1, 2002.

Samuel R Stein; Digital Measurement of Precision Oscillators; A Tutorial IEEE, Frequency Control Reference and Tutorial Information website.

D A Howe, D.W Allan, and J A. Barnes; Properties of Oscillator Signals and Measurement Methods; A Tutorial. IEEE, Frequency Control Reference and Tutorial Information website.

Jack Kusters; Fundamentals of X-Ray Orientation of Quartz Crystals; A Tutorial 2000 IEEE International Frequency Control Symposium Tutorials, Kansas City Jun. 6, 2000.

Dan Russell; Acoustics and Vibration Animations; A Tutorial IEEE, Frequency Control Reference and Tutorial Information website.

Time and Frequency Division 847, National Institute of Standards and Technology; IEEE, Frequency Control Reference and Tutorial Information website.

Arthur Ballato; Transmission-Line Analogs for Piezoelectric Layered Structures: A Ph.D. Dissertations; IEEE, Frequency Control Reference and Tutorial Information website.

Angela M. Slocum; Basic Oscillators 101—A Guide to Specifying Timing Devices: A Tutorial. Corning Frequency Control: IEEE, Frequency Control Reference and Tutorial Information website.

Mike F. Wacker; Frequency Stability Characterization in the Time Domain; A Tutorial Corning Frequency Control: IEEE, Frequency Control Reference and Tutorial Information website.

Mike F. Wacker, OCXO Specification Guideline with "Cost Saver Tips": A Tutorial Corning Frequency Control: IEEE, Frequency Control Reference and Tutorial Information website.

David Chandler; Phase Jitter—Phase Noise and Voltage Controlled Crystal Oscillators: A Tutorial Corning Frequency Control: IEEE, Frequency Control Reference and Tutorial Information website.

David R Shaner; Precision Frequency Measurment: A Tutorial Corning Frequency Control Jan. 5, 1998: IEEE, Frequency Control Reference and Tutorial Information website.

Dan Nehring; Specifying OCXOs for Base Stations; A Tutorial Corning Frequency Control: IEEE, Frequency Control Reference and Tutorial Information website.

William P. Hanson and Timothy E Wickard; Acceleration Sensitivity as a Function of Temperature: A Technical Paper. Corning Frequency Control: IEEE, Frequency Control Reference and Tutorial information website.

Lynn C. Heishman; Application Notes for Doubly Rotated Quartz Crystals: A Technical Paper. Corning Frequency Control: IEEE, Frequency Control Reference and Tutorial Information website.

Calibration of Time Base Oscillators; A Technical Paper. Corning Frequency Control: IEEE, Frequency Control Reference and Tutorial Information website.

Timothy E Wickard and Willima P Hanson; The Complication of Helium Desorption in the Helium Leak Method A Technical Paper. Corning Frequency Control: IEEE, Frequency Control Reference and Tutorial Information website.

Greg L Weaver; The Use of a Computer Model to Determine the Complex Parametric Relationships of a Crystal Oscillator Circuit. A Technical Paper. Corning Frequency Control: IEEE, Frequency Control Reference and Tutorial Information website.

James M. Griffith; Development and Advancements in SC-Cut Crystals. A Technical Paper Corning Frequency Control: IEEE, Frequency Control Reference and Tutorial Information website (first presented at the RF Expo East, 1994).

Bruce R Long; Frequency Correlation of Quartz Crystal Oscillators; A Technical Paper Corning Frequency Control: IEEE, Frequency Control Reference and Tutorial Information website (first presented at the RF Expo East, 1990).

T Wickard, W.P. Hanson, G.P. Bal; A New Low Profile Coldweld Package A Technical Paper Corning Frequency Control: IEEE, Frequency Control Reference and Tutorial Information website (first presented at the RF Expo East, 1990).

G. Weaver, W/ Hanson & T Wickard; A Insitu technique for the Resolution of Aging Contributions Between Quartz Resonators and Oscillator Circuits A Technical Paper Corning Frequency Control: IEEE Frequency Control Reference and Tutorial Information website.

W P. Hanson, T R. Meeker & L C Heishman; A New Factor Affecting the Acceleration Sensitivity of the Resonance Frequency of Quartz Crystal Resonators. A Technical Paper. Corning Frequency Control: IEEE, Frequency Control Reference and Tutorial Information website.

N. Bates and G. Weaver, Phase Noise Frequency Distributions of SC and AT Quartz Crystal Resonators. A Technical Paper. Corning Frequency Control: IEEE, Frequency Control Reference and Tutorial Information website.

G. Kurzenknabe; Practical Considerations in Specifications of High Stability Crystal Oscillators. A Technical Paper. Corning Frequency Control: IEEE. Frequency Control Reference and Tutorial Information website.

W. Hanson; Proble ion Signature in Quartz Electrodiffusion Data A Technical Paper. Corning Frequency Control: IEEE, Frequency Control Reference and Tutorial Information website.

B Long; Quartz Crystals and Oscillators A Technical Paper. Corning Frequency Control: IEEE, Frequency Control Reference and Tutorial Information website.

B. Long and G Weaver; Quartz Crystal Oscillators with Direct Resonator Heating A Technical Paper. Corning Frequency Control: IEEE, Frequency Control Reference and Tutorial Information website.

L Heishman, A Review of Progress Related to Doubly Rotated Crystals. A Technical Paper. Corning Frequency Control: IEEE, Frequency Control Reference and Tutorial Information website.

R. Zeigler, Jr ; Statistical Analysis of Allan Variance, Aging, Phase Noise, and Gravitational Sensitivity of Quartz Crystal Frequency Standards. A Technical Paper. Corning Frequency Control: IEEE, Frequency Control Reference and Tutorial Information website.

G Kurzenknabe; Vibrational Sensitivity and Phase Noise in Crystal Oscillators A Technical Paper. Corning Frequency Control: IEEE, Frequency Control Reference and Tutorial Information website.

V. Boltom; A History of the Quartz Crystal Industry in the USA A Technical Paper. Corning Frequency Control: IEEE, Frequency Control Reference and Tutorial Information website.

D Chandler; A Statistical Analysis of Temperature Dependent Time Domain Phase Jitter (MC061A1 series Bulk Acoustic Wave Quartz Crystal Oscillators). A Technical Paper. Corning Frequency Control: IEEE, Frequency Control Reference and Tutorial Information website.

C Jensik, R. Zellers & R. Lackey; A Synopsis of Quality Involvement/Improvement Programs and the Ramifications on our Industry. A Technical Paper Corning Frequency Control; IEEE, Frequency Control Reference and Tutorial Information website.

P. Brown; The Influence of Amateur Radio on the Development of the Commercial Market for Quartz Piezoelectric Resonators in the United States. A Technical Paper, Corning Frequency Control: IEEE, Frequency Control Reference and Tutorial Information website.

H. Fanus; The Quartz Crystal Industry in Carlisle, PA. A Technical Paper Corning Frequency Control: IEEE, Frequency Control Reference and Tutorial Information website.

I. Albright; The Effect of Temperature on Crystal Oscillators. A Technical Paper. Corning Frequency Control: IEEE, Frequency Control Reference and Tutorial information website.

Branching out Through Band Width; Specialists in Successful Risk Analysis; and Promising Developments from a 'Virtual Drug Company' Oak Industries Inc. featured on 'Business Now' at 9 AM Sunday, Sep. 12, on WCVB-TV (www.batv.com).

A Brief History of Coming Frequency Control. Corning Frequency Control: IEEE, Frequency Control Reference and Tutorial Information website.

McCoy Electronics Photographs fromt he OFC Archives Corning Frequency Control: IEEE, Frequency Control Reference and Tutorial Information website.

McCoy Electronics Crystal Booklet (circa 1964) from the OFC Archives. A Technical Paper. Corning Frequency Control: IEEE, Frequency Control Reference and Tutorial Information website.

S Cantor, A. Stern & B. Levy; Clock Technology. A Technical Paper IEEE, Frequency Control Reference and Tutorial Information website.

Manish Valsh, A High Precision Quartz Oscillator with Performance Comparable to Rubidium Oscillators in Many Respects A Technical Paper 1996 IEEE Frequency Control Symposium Proceedings.

John R. Vig; Quartz Crystal Resonators and Oscillators for Frequency Control and Timing Applications. A Tutorial US Army Communications—Electronics Command, AMSEL-RD-C2-PT Jan. 2001 Approved for public release Distribution is unlimited.

John R. Vig; Quartz Crystal Resonators and Oscillators for Frequency Control and Timing Applications. Product Catalog and Reference Materials. US Army Communications—Electronics Command Jan. 2001 Approved for public release. Distribution is unlimited.

I. Abramzom & R. Boroditsky; Thermodynamic Aspect of Short-Term Frequency Stability of Directly Heated Resonators. A Technical Paper. Valpey Fisher Corporation. Resource Center website.

C. Serant; Celestica Net Income Soars 110%. Industrial Article from Daily News Digest Valpey Fisher Corporation Resource Center website.

C Souza; Chip Industry Still Expecting Growth in 2001. Industrial Article from Electronic Buyers' News. Valpey Fisher Corporation Resource Center website.

Reuters; Conexant to Supply Motorola Broadband Unit Industrial Article from Daily New Digest Valpey Fisher Corporation. Resource Center website.

C. Souza; Component Avalanch Buries Suppliers. Industrial Article from Daily News Digest Valpey Fisher Corporation. Resource Center website.

R Shim; Bluetooth Bite Blunted by MS Pullout. Industrial Article ZD Net News Technology Summit Oct. 8-9, 2003 Bloomberg Auditorium, London Valpey Fisher Corporation website.

Absolute Pull Range Note Valpey Fisher Corporation website.

Training Session—Electronics Applications of Quartz Xtal Oscillators. A Power Point presentation Valpey Fisher Corporation Resource Center website.

Training Session—Crystal Environmental Specifications A Power Point presentation Valpey Fisher Corporation Resource Center website.

Training Session—Crystal Specifications A Power Point presentation. Valpey Fisher Corporation Resource Center website.

Training Session—Frequency Tolerance. A Power Point presentation. Valpey Fisher Corporation Resource Center website.

Training Session—Quartz Crystal Work, An Intuitive Approach Part 1 and Part II A Power Point presentation. Valpey Fisher Corporation Resource Center website.

Seriers QR High Precision Timebase/Reference Crystals and QT High Precision Temperature Sensor Crystals A technical Paper; Quartzdyne Inc ,Quartzdyne. Inc information website.

* cited by examiner

COMPENSATED ENSEMBLE CRYSTAL OSCILLATOR FOR USE IN A WELL BOREHOLE SYSTEM

CROSS-REFERENCE TO RELATED APPLICATIONS

This application is a divisional of U.S. patent application Ser. No. 10/618,282, now U.S. Pat. No. 7,046,584, filed Jul. 9, 2003, which is incorporated herein by reference and to which priority is claimed.

BACKGROUND OF THE INVENTION

This invention is directed toward geophysical measurement apparatus and methods employed during the drilling of a well borehole. More specifically, the invention is directed toward a compensated ensemble crystal oscillator clock system that comprises a plurality of quad compensated clocks. Physical fabrication of elements of the oscillator ensemble and cooperating data processing software minimized drift in frequency of the oscillator clock system in harsh borehole environments encountered while drilling the borehole. The oscillator clock system is particularly applicable to seismic-while-drilling operations wherein precise downhole measurements of time are required typically over a period of days.

Systems for measuring parameters within a well borehole, and geophysical parameters of earth formation in the vicinity of the well borehole, typically fall within two categorizes. The first category includes systems that measure parameters after the borehole has been drilled. These systems include wireline logging, tubing conveyed logging, slick line logging, production logging, permanent downhole sensing devices and other techniques known in the art. The second category includes systems that measure formation and borehole parameters while the borehole is being drilled. These systems include measurements of drilling and borehole specific parameters commonly known as "measurements-while-drilling" (MWD), measurements of parameters of earth formation penetrated by the borehole commonly known as "logging-while-drilling" (LWD), and measurements of seismic related properties known as "seismic-while-drilling" or (SWD).

Some measurements made while drilling a borehole require that sensor responses to parameters and events within the borehole, or "downhole", be synchronized to sensor responses and events at the surface of the earth. As an example, SWD systems typically require the accurate and precise measure of travel time of acoustic energy between the surface of the earth and a downhole assembly disposed at a known depth within the borehole. The response of a sensor to a displaced source of acoustic energy is combined with synchronized outputs of cooperating clocks to obtain the measure of travel time. This measure of travel time is subsequently used to convert acoustic impedance interfaces measured in a time domain to corresponding positions of the interfaces in a depth domain. A "downhole" clock disposed within a downhole assembly is typically synchronized with a surface or "reference" clock disposed within surface electronics equipment. The downhole assembly is then deployed within the borehole. The downhole assembly can be deployed for a period of several days with no continuous communication link, such as an electrical cable, with the surface equipment.

In order to obtain the desired accuracy and precision, SWD measurement techniques typically require downhole clock and reference clock synchronization of the order of 1 millisecond (ms), over a time period as great as several days. As an example, drift of a downhole clock is preferably equal to or less than about 3 parts per billion (ppb) in order to maintain clock synchronization with a reference clock (preferably calibrated in Coordinated Universal Time or "UTC") of about 1.0 ms or less over a period of about four days. Clocks that achieve this accuracy are available for use at room temperature. No clocks are known which provide the required accuracy in a borehole drilling environment, which typically involves elevated and varying temperature, significant shock, oscillator aging, high vibration, and other environmental conditions which adversely affect clock performance.

SUMMARY OF THE INVENTION

The compensated ensemble crystal oscillator system comprises two major components which are a plurality or "ensemble" of quad compensated clocks and software which controls and compensates the system for adverse effects encountered in a harsh downhole environment.

The ensemble of quad compensated clocks provides the opportunity for the characteristics of each quad compensated clock to be observed with respect to other quad compensated clocks in the ensemble. Each quad compensated clock comprises an oscillator circuit that cooperates with four oscillator crystals configured as a quad compensated resonator. The ensemble preferably comprises a minimum of four quad compensated clocks. This embodiment of the system will be referred to as a "quad compensated ensemble crystal oscillator" or "QCEXO". An ensemble of eight quad compensated clocks provides an extremely robust system, but additional manufacturing costs and subsequent operational and maintenance costs are incurred.

The harsh borehole environment includes elevated and varying temperature, significant shock, oscillator aging and high vibration. All of these factors degrade the accuracy and precision of any type of oscillator clock. The QCEXO system does, however, compensate for these effects.

The vector nature of acceleration sensitivity makes possible compensation techniques that will be disclosed in detail. The first is the significant variations in both magnitude and direction of the acceleration sensitivity vectors as a function of temperature. Such variations inherently limit the degree of compensation possible in single and dual resonator clock schemes as both the geometric alignment and the required amplitude drift from their calibration settings. These considerations are relaxed with the implementation of quad compensated resonator methodology. The quad compensated resonator employs four resonator crystal oscillators that are electrically connected in series, with their acceleration sensitivity vectors aligned nominally one per quadrant in a common plane. This technique has practical advantages in achieving greater than a factor of ten reductions in acceleration sensitivity in all directions, and in maintaining this reduction under conditions experienced in a borehole environment. Good mechanical design of the ensemble mounting structure, along with an oscillator circuit to which it is attached and the package in which it is housed, is critical to achieving low acceleration sensitivity.

Software used to compensate and control the QCEXO system comprises two main algorithms, which will be referred to as an "optimization" algorithm and a "time-scale" algorithm. The optimization algorithm can be applied to a single quad compensated clock. The time-scale algorithm is applicable to the ensemble of quad compensated clocks used in the OCEXO system.

The QCEXO system is calibrated with an external reference during production, and subsequently with a reference at a well site prior to deployment. Long term performance, which may otherwise be impacted by changing frequency drifts and changing temperature coefficients, is improved considerably as a result of the QCEXO system cooperating with the calibration reference.

Each quad compensated clock in the ensemble is calibrated to an accurate external frequency reference at time of the initial system calibration. During this initial calibration, information such as an estimate of the profile of the frequency versus temperature dependence of each oscillator is input into the QCEXO system. It is preferred to subsequently "field" calibrate QCEXO system to an external frequency reference available at the well site. The external frequency reference provides a calibration reference update for some of the system parameters. The QCEXO system has the ability to improve the knowledge of the characteristics of each of its members with time.

The purpose of a time-scale algorithm is to form a "virtual" clock from the ensemble of physical, quad compensated clocks whose differences from each other are measured at a sequence of dates, where a date is the displayed time of a clock as determined by counting its oscillations. The virtual clock is defined as an offset from one of the physical clocks, the offset being computed from the measurement data by the time-scale algorithm. Time-scale algorithm is designed to produce a virtual clock that is more stable than any of the physical clocks in the ensemble of quad compensated clocks, in both the short term and the long term, as measured by some stability measure such as Allan deviation or Hadamard deviation.

The entire ensemble of quad compensated clocks is modeled by a linear stochastic differential equation, whose state vector is estimated in a straightforward way by a Kalman filter from oscillator clock difference measurements.

The time-scale algorithm samples the ensemble of clocks to generate time and frequency with more reliability, stability, and frequency accuracy than any individual quad compensated clock in the ensemble. The time-scale algorithm then calculates the time offset of each of the ensemble clocks at a given reference time. Ensemble time, the time of the scale, is realized by applying the appropriate correction to any one clock. If there is no measurement noise, this value is independent of which ensemble clock is used. The input to the algorithm at a given reference time is the time difference between each quad compensated clock and another particular quad compensated clock in the ensemble. The algorithm also requires estimates of the deterministic and stochastic parameters, which characterize each clock's frequency offsets.

The QCEXO system exhibits a frequency stability of $2.8 \times 10^{-9}$ or less over a temperature range of from 0° C. to 185° C. Furthermore, the QCEXO system minimizes adverse effects due to shock, vibration and general acceleration effects, inherent frequency inaccuracy, and lastly, oscillator frequency and time jumps, activity dips and drop outs which are categorically referred to as "abnormal behavior". These performance characteristics are suited for SWD applications.

BRIEF DESCRIPTION OF THE DRAWINGS

So that the manner in which the above recited features, advantages and objects the present invention are obtained and can be understood in detail, more particular description of the invention, briefly summarized above, may be had by reference to the embodiments thereof which are illustrated in the appended drawings.

DETAILED DESCRIPTION OF THE PREFERRED EMBODIMENTS

Figure 1:
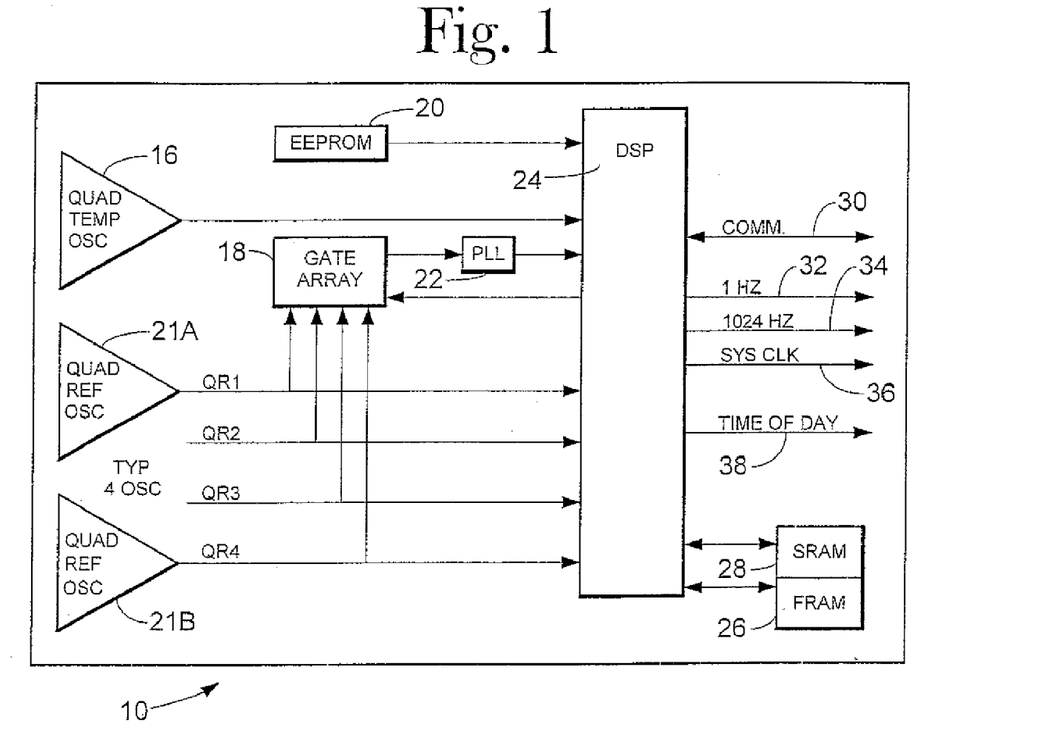
FIG. 1 is a functional block diagram of the QCEXO clock system.

FIG. 1 is a functional block diagram of the QCEXO clock system 10. The system comprises four quad compensated clocks, of which only two are shown at 20A and 20B for clarity. Outputs QR1, QR2, QR3 and QR4 from all four quad compensated clocks are input into a digital signal processor (DSP) 24. These outputs are also input to a gate array 18, which selects which reference oscillator output, or combination of reference oscillator outputs, are uses as a clock source for the DSP 24. Output of the gate array 18 is input to a phase locked loop (PLL) 22 that converts the selected clock frequency or frequencies to a clock reference signal required by the DSP 24. The gate array 18 is controlled by feedback from the DSP 24. Output QT from a temperature sensing oscillator 16 is input to the DSP 24. The temperature sensing oscillator 16 also comprises a quad compensated resonator. The quad compensation methodology compensates the temperature measurement for adverse effects of acceleration, and improves the accuracy of the temperature measurement by using the averaged output of the four oscillator crystals in the array. The quad compensated temperature signal QT is used to make temperature related compensation in the QCEXO system, as will be discussed in detail in subsequent sections of this disclosure. Preferably, one oscillator crystal, comprising the quad compensated temperature resonator, is physically located in each of four quadrants and close proximity to a corresponding one of the four quad compensated clocks in the ensemble. The averaging of outputs of the four temperature oscillator crystals then yields an accurate representation of the average temperature exposure of the clock ensemble.

Still referring to FIG. 1, an EEPROM 20 is operationally connected to the DSP 24, and provides additional storage space for programs used in the QCEXO clock system. Program and data memory, supplemental to internal memory within the DSP 24 and EEPROM 20, reside in supplemental random access memory (SRAM) 28. Non-volatile random access memory (FRAM) 26 is used for data storage. Both the SRAM 28 and the FRAM 26 are in two-way communication with the DSP 24.

Again referring to FIG. 1, a communication port 30 is used as a means for communication between the DSP 26 and an external processor, such as a reference processor used in field calibration the QCEXO system as discussed is subsequent sections of this disclosure. Outputs from the QCEXO system emerging from the DSP 24 comprise a synchronized clock signal 36, which for purposes of discussion, is the desired compensated clock signal required in SWD applications. Additional frequency signals such as 1 Hertz (Hz) and 1024 Hz as shown at 32 and 34, respectively, are also output. These signals are also typically used as timing signals in SWD systems. The time of day is output at 38.

Quad Compensated Clock

In general, it is not practical to compensate one or more resonators for vibration and shock, to a degree of accuracy required in certain geophysical measurements, such as SWD, using external measures from apparatus such as accelerometer arrays.

The vector nature of resonator acceleration sensitivity makes possible alternate compensation techniques. The first is the significant variations in both magnitude and direction of the acceleration sensitivity vector as a function of temperature. Such variations inherently limit the degree of compensation possible in single and dual resonator schemes since geometric alignment and required amplitude both drift from their calibration settings under harsh environmental conditions and over an extended period of time, such as days. These considerations are relaxed using an ensemble of four crystal resonators configured for "quad" compensation.

Figure 2:
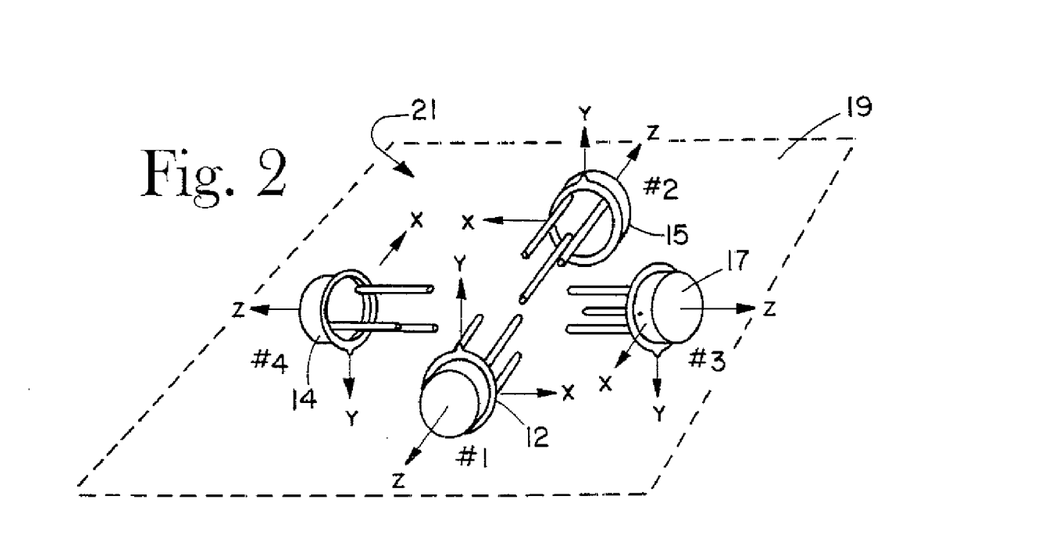
FIG. 2 is illustrates mounting orientation of oscillator crystals to form a quad compensated resonator in which acceleration and vibration sensitivities are minimized in all directions.

A quad compensated clock employs four crystals configured as a quad compensated resonator, which cooperates with oscillator circuitry. The preferred configuration of quad compensated resonator 21 is shown in FIG. 2. The crystal resonators i=1, 2, 3 and 4 are identifies at 12, 15, 17 and 14, respectively. Coordinates of each resonator are defined as $$(x_i, y_i, z_i), \text{ where } (i=1,\ldots,4). \quad (1)$$

Each crystal exhibits sensitivity to acceleration in a preferred direction. This is illustrated conceptually with "sensitivity vectors" shown for each crystal resonator 12, 15, 17 and 14. As an example, the x and z sensitivity vectors for crystal resonators 12 and 15 are aligned in opposing directions, while y sensitivity vectors are aligned in the same direction in what convention defines as the "+y" direction. As another example, the x and z sensitivity vectors for crystal resonators 14 and 17 are aligned in opposing directions, while y sensitivity vectors are aligned in the same direction in what convention defines as the "−y" direction. Crystal resonators are electrically connected in series with their acceleration sensitivity vectors aligned, nominally one per quadrant, in a common plane 19 defined as $$z_1 = z_2 = z_3 = z_4 \quad (2)$$

If the crystal resonators are configured in pairs so that maximum acceleration sensitivity vectors are in opposite directions, then a combination of the response of each resonator crystal will exhibit a significantly reduced sensitivity to vibration and shock. This configuration technique typically achieves a greater than a factor of ten reductions in acceleration sensitivity, and maintains this reduction over extended periods of time in harsh SWD environmental conditions. No external measure of acceleration is used in the compensation technique. More detailed information on sensitivity vectors for crystal resonators and their relationship to acceleration and vibration sensitivity can be found in "Theory and Design of Crystal Oscillators Immune to Acceleration: Present State of the Art", John A. Kosinski, US Army CECOM, Ft. Monmouth, N.J., 2000 IEEE/EIA International Frequency Control Symposium and Exhibition. Material contained in this publication is entered into this disclosure by reference.

QCEXO Design Features

Good mechanical packaging of each crystal comprising a quad compensated resonator, and cooperating oscillator circuitry to which it is attached, is critical in achieving low acceleration sensitivity in the QCEXO clock system. In addition, each quad compensated clock is insulated within the packaging to reduce sharp temperature fluctuations and thermal transient effects. Static frequency versus temperature effects are corrected by the time-scale algorithm, which will be discussed in a subsequent section of this disclosure. Dynamic frequency versus temperature effects, resulting from warm-up and thermal shock, are corrected for using the optimization algorithm, that is discussed in a subsequent section of this disclosure.

High temperature accelerates oscillator aging. Oscillator aging in quad compensated clocks is detected and corrected the optimization algorithm. Furthermore, it is highly desirable to apply power to the quad compensated clocks at all times. Thermal history (hysterisis) of each quad compensated clock is detected and corrected by the optimization algorithm.

Two basic designs for the quad compensated clocks 12, 14, 15 and 17 can be used in the QCEXO system. These designs are known in the art as "ovenized" and "non-ovenized". Each of these designs has advantages and disadvantages.

The preferred crystal selection for an ovenized design is a dual-mode SC-cut crystal. For a given crystal cut, frequency of the crystal is a function of temperature. The optimum place to sense temperature is in the crystal itself, which is the frequency determining element of the oscillator. A dual-mode oscillator simultaneously excites C and B modes in a 3rd overtone resonator. It has the advantage of deriving the temperature of the crystal using the characteristics of the crystal itself. This overcomes temperature uncertainty and thermal gradient errors. Frequency as a function of temperature is accomplished by comparing the two resonant modes. The difference varies almost linearly with temperature. The disadvantage of the dual-mode crystal oscillator is that it must use a heat source to operate at a high inflection temperature, which uses considerable power.

Downhole power is typically limited in SWD systems. A non-ovenized design is, therefore, preferred in the QCEXO system. The preferred crystals for the non-ovenized design are series QR and QT crystals manufactured by Quartzdyne. Because the QCEXO system is preferably non-ovenized, it must be able to operate over a broad temperature range encountered in surface calibration and borehole environments. The disadvantage is that the temperature sensing crystal and the frequency reference crystals can have a temperature gradient, which would cause an error in the frequency versus temperature measurement, unless minimized by system design and compensation techniques. The advantage is, as previously stated, low power requirement.

Referring again to both FIGS. 1 and 2, QR crystals are preferred for the quad compensated clocks 12, 14, 15, and 17, and QT crystals are preferred for the quad compensated temperature sensing oscillator 16. QR crystals have a frequency versus temperature stability of about ±20 ppm over the temperature range of 0-180° C., yielding a frequency gradient versus temperature of less than 1 part per million per degree Centigrade (ppm/° C.). A relatively small frequency gradient is, of course, preferred for the quad compensated clocks. QT crystals are much more responsive to temperature, having a frequency vs. temperature stability of ±4500 ppm yielding a frequency versus temperature ratio of ~135 Hz/° C. at 25° C., to ~260 Hz/° C. at 177° C. over the temperature range of 0-180° C. Repeatability is better than 0.001° C. QT crystals with a relatively large frequency gradient are, therefore, used in the quad compensated temperature oscillator 16 to measure oscillator temperature with high precision. $1 \times 10^{-6\circ}$ C.

Software

Software is used to compensate and control the QCEXO system. A simplified chart illustrating the QCEXO system software 60, and software interaction with some elements of the circuit elements of the QCEXO system, is conceptually illustrated in FIG. 3. The system software 60, defined by a broken line box, comprises two main algorithms that will be referred to as an "optimization" algorithm 56 and a "time-scale" algorithm 58. The optimization algorithm processes output from individual quad compensated clocks. The time-scale algorithm processes outputs from the ensemble of quad compensated clocks. The system software 60 preferably resides within the DSP 24 shown in FIG. 1.

Figure 3:
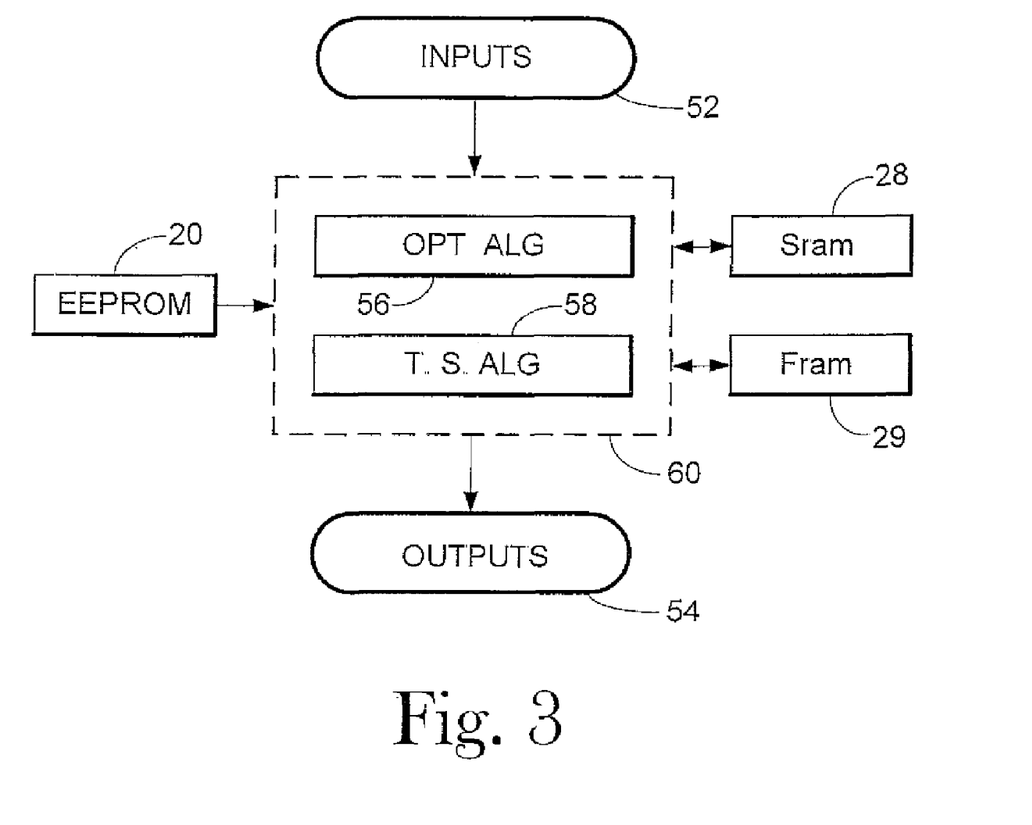
FIG. 3 is chart illustrating the QCEXO system software and its interaction with some of the elements of the QCEXO system.

Referring to FIGS. 1 and 3, outputs QR1, QR2, QR3 and QR4 from the quad compensated clocks 12, 14, 15 and 17, output from the PLL 22, and output from the temperature sensing oscillator 16 are input at 52. In addition, outputs from one or more borehole environmental sensors are input at 52. Calibration data received by the communication port 30 are also input at 52. Outputs at 54 comprise previously discussed parameters computed in the DSP 24 including the synchronized clock signal 36, frequency signals at 1 Hz and 1024 Hz as shown at 32 and 34, respectively, and the time of day 38. The EEPROM 20, SRAM 28 and FRAM 29 cooperate with the system software 60 as illustrated conceptually with arrows.

The optimization algorithm 56 of QCEXO system is calibrated with oscillator specific parameters, such as temperature coefficients, during production with an external reference (not shown) via the communication port 30. Subsequently, the QCEXO system is again calibrated with a well site reference at a well site prior to deployment (see FIG. 4a), again via the communication port 30. Long term performance of the QCEXO system, which would otherwise be impacted by changing frequency drifts and changing temperature coefficients, is improved considerably by utilizing data input from the calibration references.

Each quad compensated clock 12, 14, 15 and 17 in the ensemble 21 is initially calibrated to an accurate external frequency reference at time of initial system calibration. During this initial calibration, additional information, such as an estimate of the profile of the frequency versus temperature dependence of each oscillator in the ensemble 21, is input into the QCEXO system. Again, it is preferred to subsequently calibrate each crystal oscillator to an external frequency reference available at the well site. The external frequency reference provides a calibration reference update for some of the oscillator specific parameters residing within the software. The ensemble 21 and cooperating software improves the knowledge of the characteristics of each of its member quad compensated clocks with time.

Again referring to FIG. 3, the purpose of a time-scale algorithm 58 is to form a "virtual" clock from the ensemble 21 of physical clocks. Additional information on virtual clocks is given in "Forming Stable Time Scales from the Jones-Tyron Kalman Filter", Charles A. Greenhal, Jet Propulsion Laboratory, California Institute of Technology, Apr. 5, 2002. Material contained in this publication is entered into this disclosure by reference. Differences of each quad compensated clock from the other clocks in the ensemble are measured at a sequence of dates, where a date is the displayed time of a clock as determined by counting its oscillations. The virtual clock is defined as an offset from one of the physical clocks, the offset being computed from the measurement data by the time-scale algorithm. The time-scale algorithm is designed to produce a virtual clock that is more stable than any of the physical clocks in the ensemble, in both the short term and the long term, as defined by some stability measure such as Allan deviation or Hadamard deviation.

The entire ensemble is modeled by a linear stochastic differential equation, whose state vector is estimated in a straightforward way by a Kalman filter from oscillator clock difference measurements.

If the tick of each clock in the ensemble 21 is offset by its Kalman phase estimate, a single point is defined on a time axis. It is logical to regard this point as the estimated center of the ensemble, and to use the sequence of these values as a time-scale. This time-scale, realized as TA National Institute of Standards and Technology (NIST), follows the ensemble of the clock with the best long-term stability, regardless of its short-term stability.

The time-scale algorithm 58 samples each quad compensated clock 12, 14, 15 and 17 in the ensemble of clocks 21 to generate time and frequency with more reliability, stability, and frequency accuracy than any of the individual clocks in the ensemble. The time-scale algorithm 58 also calculates the time offset of each of the ensemble clocks at a given reference time. Ensemble time, the time of the scale, is realized by applying an appropriate correction to any one clock in the ensemble 21. If there is no measurement noise, this value is independent of which clock in the ensemble is used. The input to the time-scale algorithm 58, at a given reference time, is the time difference between each quad compensated clock and another particular quad compensated clock comprising the ensemble. The algorithm also requires estimates of the deterministic and stochastic parameters, which characterize each clock's frequency offsets.

It is important to note that the time of a quad compensated clock is not measured. Only time differences are measured between quad compensated clocks in the ensemble 21. The ensemble time which the algorithm 58 generates is, therefore, not observable. For this reason, it is inappropriate to use an accuracy algorithm, such as a Kalman filter, to generate time by minimizing time error. The time-scale algorithm 58 does, however, optimize time and time interval stability.

It is also important to realize that a clock, as a physical system, produces a frequency. The time of the clock is artificially derived from the frequency, which is the true physical quantity. Because of this, all of the parameters, which characterize clock performance, describe aspects of the frequency. One can use these parameters to optimize time uniformity and frequency accuracy. The time scale algorithm that optimizes time accuracy has a feature which allows the quad compensated clock with the best long term stability to dominate the scale, thus sacrificing much of the performance of other clocks, especially in short term.

It is again emphasized that all models are virtual in that they are calculated by the system software, stored within the non-volatile random access memory (FRAM) 26, and then used in subsequent calculations of clock parameters of interest.

The system software 60 combines aspects of the NIST AT1 algorithm with techniques from Kalman filtering to estimate clock states representing the random walk plus drift of the frequency offsets of each clock, as well as the variance of these states. Information regarding NIST AT1 is found in "A New Time-scale Algorithm: AT1 Plus Frequency Variance", M. Weiss and T. Weissert, NIST, 576, which is entered into this disclosure by reference. For a given clock, this state, which will be referred to as "Y", is not a physical state, but a mathematical estimate of the frequency offset in the presence of white noise modulating the frequency. The variance of this state is a measure of confidence of this estimate.

The physical meaning of Y can be clarified with the following example. For time keeping, Y is defined to be the normalized rate of a clock. For example, if a wristwatch gains one second per day, then the state Y=1 second/86400 seconds=1.157 $e^{-5}$, and the time interval "J" is equal to 1 day. It should be noted that Y is dimensionless.

Frequency step detection always requires examining the data over some time period. In nearly real time operation, it is possible to compare the estimate of average frequency offset over a time interval with the filtered estimate from the beginning of that time interval. Using the estimate of frequency deviation as a test for outliers, it can be determined if a frequency step occurred in the recent past.

Estimates of Y are smoothed in post-processing by combining forward and backward filters. The proper way to combine these filters is well defined in Kalman filter theory. Essentially, the reciprocal of the forward and backward filter variances are used as weights to combine their respective state estimates at a given reference time. Care must be taken not to incorporate the data at that time in both filters before combining them, since they would then not be independent estimates. Thus, at a given reference time, extrapolated estimates of state and variance from one direction are used (the backward filter as an example), and this state estimate is combined with the one from the forward direction which has been updated with the data.

The AT1 time-scale is adaptive once clock parameters characterizing the short and the long term behavior of the clocks are known.

Variance $\sigma_Y$ of the states $Y_i$ is preferably determined using the Allan variance equation. The Allan variance equation is $$\sigma_Y^2(\tau) = \frac{1}{2}\{(\Delta Y_i)^2\} \quad (3)$$

where $\tau$=time. Each value of $Y_i$ in a set has been averaged over a time interval J and the values of $Y_i$ are taken in a contiguous series with no time delay between the measurements of each. The brackets { } denote the expectation value. For a finite data set, it is taken as the average value of the quantity enclosed in the brackets. The $\Delta Y_i$ denotes the finite difference of the measures of $Y_i$. Stated mathematically, $$\Delta Y_i = Y_{i+1} - Y_i. \quad (4)$$

where i denotes the $i^{th}$ measurement of $Y_i$. In total, each adjacent finite difference $\Delta Y_i$ is squared, and these values are then averaged over the data set and divided by 2. Division by 2 causes this variance to be equal to the classical variance if the $Y_i$'s are taken from a random and uncorrelated set, commonly referred to as "white noise".

The advantage of Allan variance over the classical variance is that the Allan variance converges for most of the commonly encountered types of noise, whereas the classical variance does not always converge to a finite value. Flicker noise and random walk noise are two examples, which commonly occur in clocks and in nature, where the classical variance does not converge.

In summary, the system software 60 cooperates with various elements of the QCEXO system and uses predetermined algorithms and calibration data to provide features including:

(1) assuring that three or more independent quad compensated clocks of the clock ensemble provide statistical separation capability;

(2) if the measurement noise is small, providing the opportunity to calculate the time difference between any two quad compensated clocks in the ensemble using time differences taken simultaneously between adjacent clocks;

(3) calculating of the short-term and the long-term frequency stability characteristics of each quad compensated clock in the ensemble, considering statistical independence of the clocks;

(4) providing stochastic performance parameters which allow the optimum estimate of the times, the frequencies, the relative frequency drifts, and the weighting factors for each of the quad compensated clocks in the ensemble;

(5) if an ensemble clock has abnormal behavior over a measurement cycle, providing de-weighting of that clock so that the ensemble output is not degraded;

(6) if time errors correlate with temperature changes, then using this information to upgrade the temperature profile model resident within the system software;

(7) as field environment changes are sensed by one or more external environmental sensors, adaptively changing appropriate algorithms within the system software as required by these operational environment changes;

(8) as each quad compensated clock in the ensemble ages, updating the algorithm estimates of these parameters thereby improving the performance of the ensemble output as time progresses.

(9) storing, for future calculations, operating characteristics of each contributing crystal oscillator of each quad compensated clock in the ensemble;

(10) detecting and compensating for any noise changes in any quad compensated in the ensemble;

(11) detecting and compensating for any relative frequency drifts in any quad compensated clock in the ensemble;

(12) detecting and compensating for any changes in relative temperature profiles in any quad compensated clock in the ensemble; and (13) outputting from the QCEXO a frequency stable to less than about $3 \times 10^{-9}$ over a temperature range of 0 to 185° C.

Preferably, features 3 and 8-12 are provided in the optimization algorithm. Preferably, features 1, 2, 4-7, and 13 are provided in the time-scale algorithm. It should be understood that both algorithms can be modified as to the performance of these and other features. It should also be understood that other analytical and control functions are performed by the system software, but these tasks are beyond the scope of this disclosure.

It is noted that changes in the long-term stability, the absolute frequency drift, and in the absolute temperature profile can only be sensed when there is an external reference attached. Otherwise, these parameters are computed relative to the ensemble.

The QCEXO clock system exhibits a frequency stability of preferably $2.8 \times 10^{-9}$ or less over a temperature range of from 0° C. to 185° C. This level of stability is obtained because system minimizes adverse effects due to shock, vibration and general acceleration effects, inherent frequency inaccuracy, and lastly, oscillator frequency and time jumps, activity dips and drop outs which are categorically referred to as "abnormal behavior".

Operations

Figure 4A:
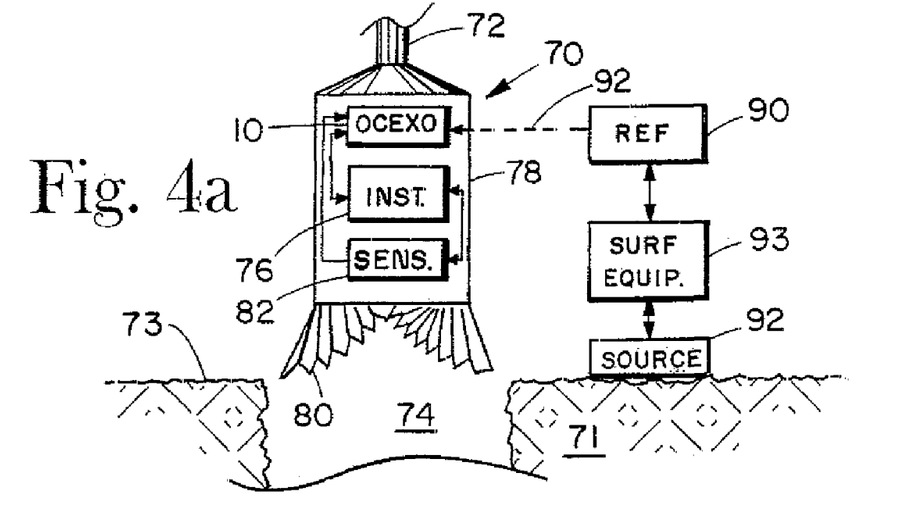
FIG. 4a is a conceptual illustration a borehole assembly, containing a OCEXO system, which is terminated at one end by a drill bit and suspended above the surface of the earth at a second end by conveyance structure which is shown as a drill string.

FIG. 4a conceptually illustrates a borehole assembly 78 terminated at one end by a drill bit 80 and suspended above the surface 73 of the earth at a second end by conveyance structure 72 which, in this illustration, is a drill string. The borehole assembly 78 comprises a QCEXO system 10 that is operationally connected to an instrument section 76. The instrument section comprises power and control means for the QCEXO system 10. The borehole assembly 78 further comprises a sensor section 82 that contains one or more environmental sensors and one or more geophysical sensors. Environmental sensor responses are used to correct the QCEXO system for a variety of static and dynamic environmental effects, as discussed previously. The geophysical sensors are used to determine parameters of earth formation 71 in the vicinity of the borehole 74, as the drill bit 80 is subsequently used to advance a borehole 74. Outputs from the geophysical sensors are typically combined with the quad compensated clock output from the QCEOX system to obtain one or more geophysical parameters of the formation 71 in the vicinity of the borehole 74. The sensor section 82 is preferably powered and controlled by the instrument section 76.

Still referring to FIG. 4a, assume that the conceptual illustration represents a seismic-while-drilling system. Embodied as a SWD system, the sensor section 82 comprises at least one acoustic transducer to measure the arrival and the characteristics of acoustic energy emitted by an acoustic source 92 disposed on the surface 73. The source 92 is preferably controlled by surface equipment 93. It should be understood that in certain SWD techniques, the positions of source and sensor can be reverse. Furthermore, multiple sources and multiple sensors can be deployed, as is known in the seismic art.

Referring now to FIGS. 4a and 1, the QCEXO system is shown being calibrated by a well site reference 90 through the communication port 30 (see FIG. 1) by means of a communication link 92 which can be a short range radio frequency (RF) link, a magnetic link, or preferably a hard wire link. The well site reference 90 is preferably powered and controlled by the surface equipment 92. Functional calibration of the QCEXO system has been discussed in previous sections of this disclosure.

Figure 4B:
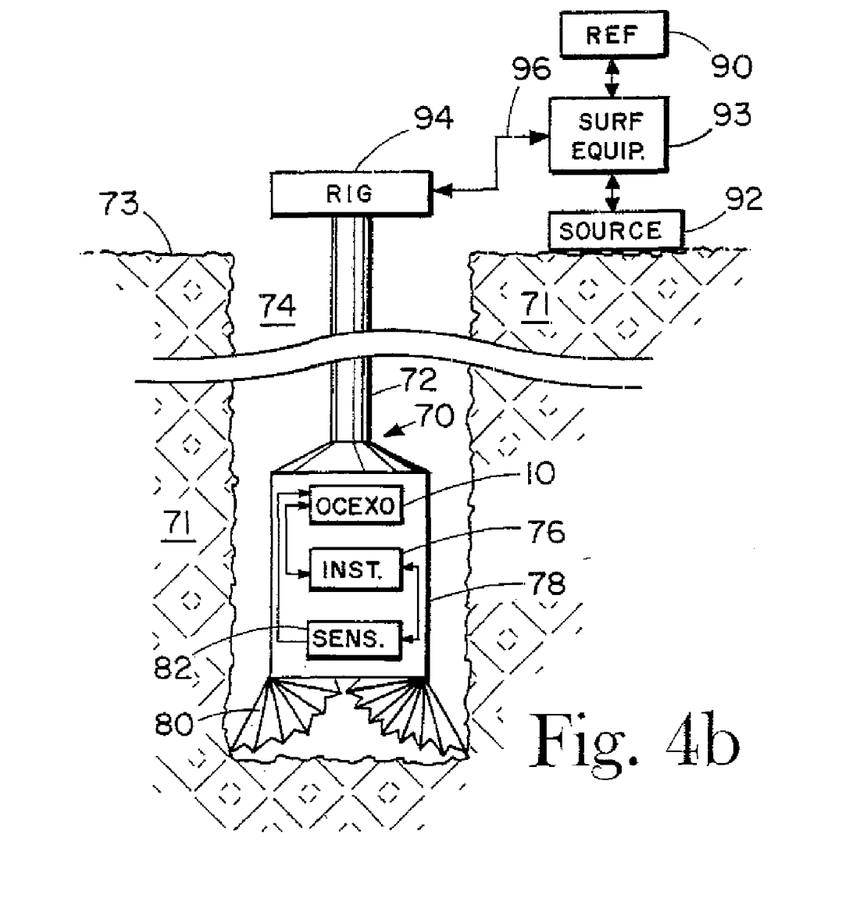
FIG. 4b is a conceptual illustration of a borehole being advanced by action of the drill bit which is rotated by action of a rotary drilling rig upon the drill bit and borehole assembly through the drill string.

FIG. 4b is a conceptual illustration of the borehole 72 being advanced by action of the drill bit 80 which is rotated by means of the drill string 72 in cooperation with a rotary drilling rig 94. The drilling rig 94 is operationally connected to the surface equipment 93.

In SWD operations, synchronization between a reference clock (not shown), the well site reference 90, and the QCEXO system 10 must be maintained to within a predetermined limit over a period of days. Drift of the QCEXO system 10 is, therefore, minimized while downhole using apparatus and methods discussed above in great detail. Subsequently, the borehole assembly 78 is removed from the borehole 74. Sensor response data and corresponding timing data from the QCEXO system 10 are transferred from the borehole assembly 78, via the link 92. Alternately, sensor response data can be transferred using a dedicated transmission links (not shown). Geophysical parameters of interest are then typically determined by combining (using a data processor) sensor response data, QCEXO system timing data, and well site reference time data. The data processor (not shown specifically) can be contained within the surface equipment 93, or can be remote from the well site. At least partial combination of data can alternately be done by means of a downhole data processor contained in the instrument section 76.

The system illustrated in FIGS. 4a and 4b is assumed to be a SWD system, for purposes of discussion. It should be understood that apparatus and methods of this disclosure are applicable to any measurement-while-drilling (MWD) or logging-while-drilling (LWD) system which employs a downhole clock that must remain in synchronization with a surface reference clock to within a given tolerance. Such systems include nuclear systems employing clock driven pulse height analyzers that are used to measure nuclear radiation intensity as a function of nuclear radiation energy. Another example is a pulsed neutron system in which the formation is irradiated with timed, sequential bursts of neutrons. Radiation induced by these neutrons is measured sequentially at predetermined time intervals. Timing parameters must be held within close tolerances in order to obtain accurate and precise measurements of parameters of interest.

The QCEXO system is not limited to conveyance by a drill string. The conveyance structure 72 can be other types of tubulars such coiled tubing, or alternately a cable structure such as a slick line, and the like.

While the foregoing disclosure is directed toward the preferred embodiments of the invention, the scope of the invention is defined by the claims, which follow.

What is claimed is:

1. A system for measuring a parameter of earth formation in the vicinity of a borehole, the system comprising:
   (a) a borehole assembly comprising
      (i) a quad compensated ensemble crystal oscillator system comprising an ensemble of quad compensated clocks, each said quad compensated clock comprising four oscillator crystals, wherein for each said quad compensated clock, said oscillator crystals in each said quad compensated clock are configured relative to a sensitivity vector of each said oscillator crystal to form a quad compensated resonator, and outputs of said oscillator crystals in said quad compensated resonator are combined to form a quad compensated clock output for each quad compensated clock, and
      (ii) a geophysical sensor;
   (b) a conveyance structure for conveying said borehole assembly along said borehole;
   (c) means for combining said quad compensated clock outputs to form a quad compensated ensemble crystal oscillator clock output, and
   (d) means for combining output from said geophysical sensor with said quad compensated ensemble crystal oscillator clock output to determine said parameter of earth formation.

2. The system of claim 1 further comprising a well site reference to which said quad compensated ensemble crystal oscillator system is calibrated.

3. The system of claim 1 wherein said conveyance structure comprises a tubular.

4. The system of claim 1 wherein said conveyance structure comprises a drill string.

5. The system of claim 1 wherein said conveyance structure comprises a cable.

6. The system of claim 1 wherein said system is a seismic-while-drilling system.

7. The system of claim 1 wherein said system is a nuclear logging-while-drilling system.

8. The system of claim 1, wherein said borehole assembly comprises a processor and a quad compensated temperature sensor; and wherein during a predetermined time interval, said quad compensated clock output is combined with output from said quad compensated temperature sensor using a compensation algorithm resident in said processor cooperating with said quad compensated clock to correct said quad compensated clock output for variations in crystal properties.

9. The system of claim 1, wherein the borehole assembly comprises a processor cooperating with each said quad compensated resonator, said processor using a compensation algorithm resident in said processor and correcting each said quad compensated clock output for changes in response properties of said crystals.

10. The system of claim 1, wherein said ensemble of quad compensated clocks comprises four said quad compensated clocks, and wherein said means for combining comprises means for combining each said quad compensated clock outputs from each said quad compensated clock to yield a quad compensated ensemble crystal oscillator clock output exhibiting less frequency drift as a function of time than any one of said quad compensated clock in said ensemble.

11. A method for measuring a parameter of earth formation in the vicinity of a borehole, the method comprising:
(a) providing a borehole assembly comprising
  (i) a quad compensated ensemble crystal oscillator system comprising an ensemble of quad compensated clocks, each said quad compensated clock comprising four oscillator crystals; wherein for each said quad compensated clock, said oscillator crystals in each said quad compensated clock are configured relative to a sensitivity vector of each said oscillator crystal to form a quad compensated resonator, and outputs of said oscillator crystals in said quad compensated resonator are combined to form a quad compensated clock output, and
  (ii) a geophysical sensor;
(b) conveying said borehole assembly along said borehole by means of a conveyance structure;
(c) combining said quad compensated clock outputs to form a quad compensated ensemble crystal oscillator clock output; and
(d) combining output from said geophysical sensor with said quad compensated ensemble crystal oscillator clock output to determine said parameter of earth formation.

12. The method of claim 11 further comprising calibrating said quad compensated ensemble crystal oscillator system to a well site reference.

13. The method of claim 11 wherein said conveyance structure comprises a tubular.

14. The method of claim 11 wherein said conveyance structure comprises a drill string.

15. The method of claim 11 wherein said conveyance structure comprises a cable.

16. The method of claim 11 wherein said system is a seismic-while-drilling system.

17. The method of claim 11 wherein said system is a nuclear logging-while-drilling system.

18. The method of claim 11, wherein providing the borehole assembly comprising providing a processor and a quad compensated temperature sensor, wherein during a predetermined time interval, said quad compensated clock output is combined with output from said quad compensated temperature sensor using a compensation algorithm resident in said processor cooperating with said clock to correct said quad compensated clock output for variations in crystal properties.

19. The method of claim 11, wherein providing the borehole assembly comprises providing a processor cooperating with each said quad compensated resonator, said processor using a compensation algorithm resident in said processor and correcting each said quad compensated clock output for changes in response properties of said crystals.

20. The method of claim 11, wherein said ensemble of quad compensated clocks comprises four said quad compensated clocks, and wherein combining said quad compensated clock outputs to form the quad compensated ensemble crystal oscillator clock output comprises combining each said quad compensated clock output from each said quad compensated clock to yield a quad compensated ensemble crystal oscillator clock output exhibiting less frequency drift as a function of time than any one of said quad compensated clock in said ensemble.

* * * * *